United States Patent
Stanley

(10) Patent No.: US 8,885,355 B2
(45) Date of Patent: Nov. 11, 2014

(54) DEVICE HAVING SNAPS WITH SOLDERED SNAP MEMBERS

(75) Inventor: Craig Matthew Stanley, Campbell, CA (US)

(73) Assignee: Apple Inc., Cupertino, CA (US)

( * ) Notice: Subject to any disclaimer, the term of this patent is extended or adjusted under 35 U.S.C. 154(b) by 490 days.

(21) Appl. No.: 13/177,246

(22) Filed: Jul. 6, 2011

(65) Prior Publication Data

US 2013/0010406 A1     Jan. 10, 2013

(51) Int. Cl.
*H05K 7/00* (2006.01)
*H05K 7/12* (2006.01)
*H05K 5/00* (2006.01)
*H05K 3/30* (2006.01)
*H01H 13/86* (2006.01)
*H05K 1/02* (2006.01)
*H01H 9/02* (2006.01)

(52) U.S. Cl.
CPC .... *H05K 5/0013* (2013.01); *H05K 2201/09063* (2013.01); *H05K 2201/0311* (2013.01); *H05K 3/301* (2013.01); *H01H 2223/04* (2013.01); *H01H 13/86* (2013.01); *H05K 1/02* (2013.01); *H05K 2201/10053* (2013.01); *H01H 9/0228* (2013.01)
USPC .......... 361/760; 361/748; 361/753; 361/759; 361/807; 200/237

(58) Field of Classification Search
USPC .............. 361/679.01, 679.02, 748, 829, 832, 361/605, 799, 753, 759–760, 807; 174/535, 174/520, 51, 260; 200/237, 318, 320, 321, 200/323, 329, 333, 341; 381/370, 384
See application file for complete search history.

(56) References Cited

U.S. PATENT DOCUMENTS

| 4,013,855 | A | 3/1977 | Reichen et al. |
| 6,007,377 | A * | 12/1999 | Cook ........................... 439/587 |
| 6,727,446 | B1 | 4/2004 | Mayo et al. |
| 7,113,410 | B2 * | 9/2006 | Pawlenko et al. .............. 361/818 |
| 7,210,963 | B2 * | 5/2007 | Chintala et al. ................ 439/594 |
| 8,144,915 | B2 * | 3/2012 | Hankey et al. ................. 381/384 |
| 8,164,898 | B2 * | 4/2012 | Chen et al. ............... 361/679.55 |
| 8,456,864 | B2 * | 6/2013 | Stiehl et al. ................... 361/832 |
| 2009/0059485 | A1 | 3/2009 | Lynch et al. |
| 2010/0054493 | A1 * | 3/2010 | Lin et al. ........................ 381/74 |
| 2011/0255850 | A1 * | 10/2011 | Dinh et al. ..................... 396/176 |

FOREIGN PATENT DOCUMENTS

EP         1469565        3/2006

* cited by examiner

*Primary Examiner* — Angel R Estrada
*Assistant Examiner* — Dimary Lopez Cruz
(74) *Attorney, Agent, or Firm* — Treyz Law Group; G. Victor Treyz

(57) ABSTRACT

A structure such as a button may have a substrate. Components such as switches may be mounted on the substrate. The substrate may be a printed circuit board with solder pads. A snap member may be soldered to one of the solder pads. A metal clip may have a snap arm with an opening. The metal clip may be attached to the printed circuit board. When attached, the opening in the snap arm may mate with the snap member that is soldered to the solder pad on the printed circuit board. The printed circuit board may be attached to a button housing member. A button cover member may be attached to the clip. A ground connection may be formed between the metal clip and the snap member by providing the snap member with structures that bear against the metal clip and form an electrical connection.

9 Claims, 8 Drawing Sheets

US 8,885,355 B2

DEVICE HAVING SNAPS WITH SOLDERED SNAP MEMBERS

This relates generally to snap structures and, more particularly, to snap structures for use in assembling electronic device structures to form electronic devices.

Electronic devices often contain circuit components that are mounted to printed circuit boards. A finished device may include structures that cover external surfaces of the device. The covering structures may help isolate internal components such as printed circuit boards and switches from the environment and may provide a cosmetic exterior surface for the device. In a device such as a button, part of a covering structure may serve as a flexible button cover that is pressed by a user during operation of a button.

Challenges can arise in attaching exterior structures such as covering structures to internal components such as printed circuit boards in a button or other device. In some devices, snaps are used in attaching pieces of a device together. If care is not taken, however, the use of snaps may cause delicate structures to break, may not allow covering structures to be attached properly, may lead to undesirable fabrication complexity, and may give rise to other difficulties.

It would therefore be desirable to be able to provide improved snap structures for devices such as buttons.

SUMMARY

A structure such as a button or other device may have a printed circuit board or other substrate. Components such as switches and other circuitry may be mounted on the substrate.

The substrate may be a printed circuit board with solder pads. A snap member may be soldered to one of the solder pads. The snap member may be formed from a bent metal strip, from a machined or cast metal structure, or other suitable snap structure.

A metal clip may have a snap arm with an opening. The metal clip may be attached to the printed circuit board using a snap formed from the snap member and the snap arm. When attached, the opening in the snap arm may mate with the snap member that is soldered to the solder pad on the printed circuit board.

The printed circuit board may be attached to a button housing member. A button cover member may be attached to the clip. The button cover may be formed from a flexible plastic structure that is heat staked to the metal clip.

A ground connection may be formed between the metal clip and the snap member. To ensure a low-contact-resistance path between the clip and the snap member, the snap member may be provided with structures such as spring structure that bear against the metal clip and form an electrical connection.

Further features of the invention, its nature and various advantages will be more apparent from the accompanying drawings and the following detailed description of the preferred embodiments.

DETAILED DESCRIPTION

Figure 1:
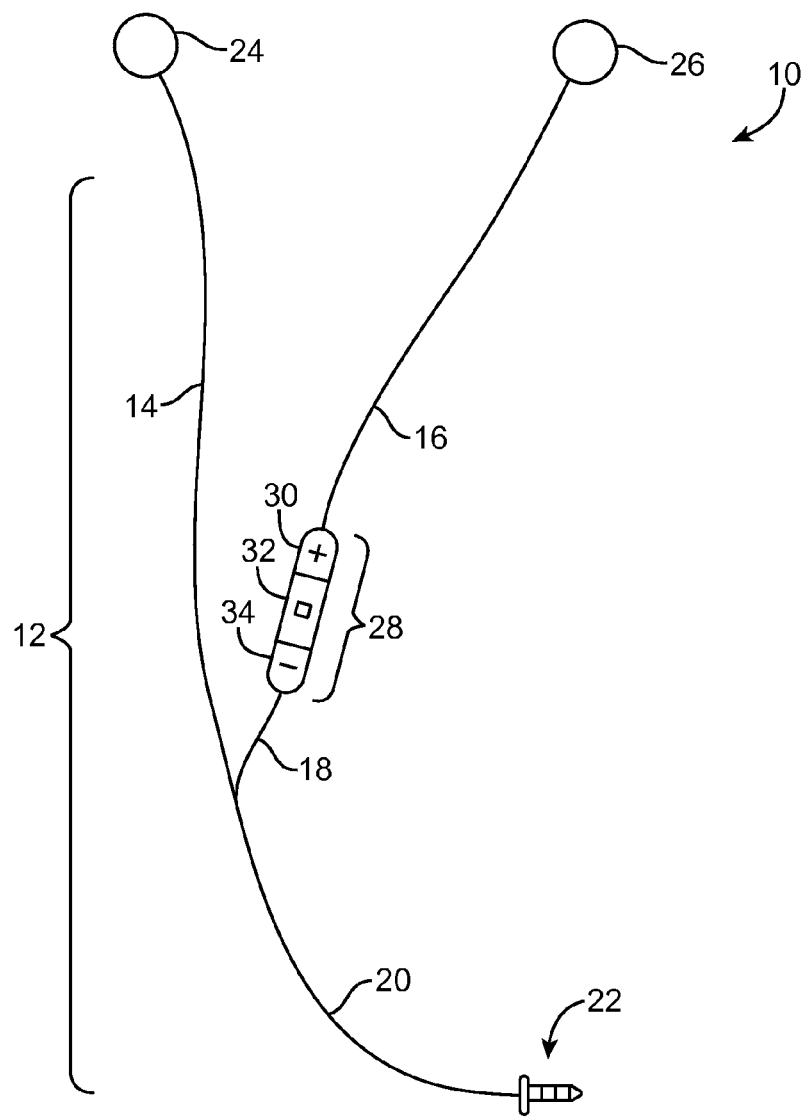
FIG. 1 is a perspective view of an illustrative headset that contains a button in accordance with an embodiment of the present invention.

Electronic equipment such as computers, handheld devices, cellular telephones, media players, portable devices, accessories, and other equipment often contain internal device components mounted on substrates such as printed circuit boards. Consider, as an example, headset 10 of FIG. 1. Headset 10 may contain speakers such as left and right speakers 24 and 26. Wires 12 may be used to couple speakers 24 and 26 to audio jack 22. Wires 12 may contain two wires 14 that provide signals to speaker 24 and two wires 16 that provide signals to speaker 26. Button 28 may be coupled to a pair of button wires. The two button wires that are coupled to button 28 and the two speaker wires in path segment 16 may form a set of four wires 18. Segment 20 of wire path 12 may contain six wires (two from path 14 and four from path 18). These wires may be coupled to the contacts in audio jack 22.

Button 28 may contain different portions such as portions 30, 32, and 34, each of which may be associated with different operations (e.g., functions associated with controlling an attached portable device).

Devices such as button 28 and other electronic equipment may contain components such as switches, integrated circuits, and other circuitry and components that are mounted to a substrate. The substrate may be, for example, a rigid printed circuit board, a flexible printed circuit board, a plastic carrier, or other suitable substrate. The exterior of button 28 may be covered with a button cover structure. To accommodate flexing, it may be desirable to form the button cover of a flexible material such as plastic.

To facilitate attachment of device structures, it may be desirable to provide a device with one or more snaps. A snap may have a first portion (sometimes referred to as a snap arm or snap member) that has an opening. The snap may also have a second portion (sometimes referred to as a snap prong or snap member) that mates with the opening. The second portion may have a ramp-shaped surface that helps deflect the snap arm so that the prong enters the hole in the snap arm. Because the ramp-shaped surface of the second portion of the snap can be used in leading the snap arm over the prong, the second snap portion may sometimes be referred to as a lead-in member.

Snaps based on snap arms and snap lead-in members may be used in interconnecting any suitable structures (e.g., mechanical structures, electrical structures, substrates such as rigid and flexible printed circuit board, structures, housing structures such as button covers and other external covering structures and/or internal housing structures, or other suitable mechanical and/or electrical structures). The use of snaps in assembling portions of a device such as button 28 of FIG. 1 is merely illustrative. Snaps may be used in connecting any suitable structures, if desired.

Figure 2:
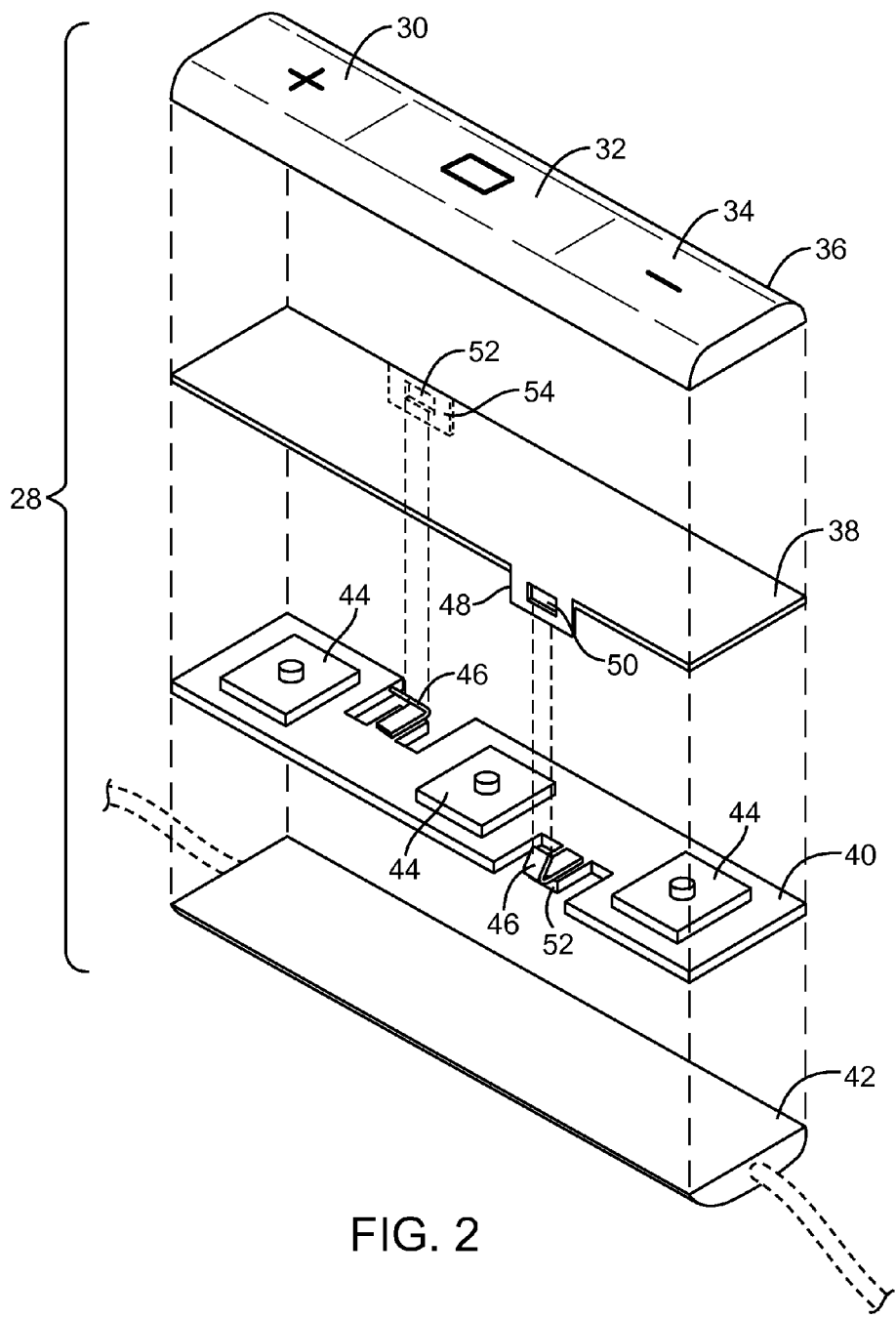
FIG. 2 is an exploded perspective view of an illustrative button having snaps formed in accordance with an embodiment of the present invention.

FIG. 2 is an exploded perspective view of button 28. As shown in FIG. 2, button 28 may have an upper housing such as button cover structure 36 (sometimes referred to as a button cover or button cover member) and a lower housing such as lower button housing structure 42. Button cover 36 may, if desired, be formed from a soft plastic such as a blend of polycarbonate and acrylonitrile butadiene styrene (PC/ABS) and may have labels corresponding to the different functions that may be performed by a tethered device when a user presses regions 30, 32, and 34, respectively.

Button 28 may contain internal components such as switches 44 that are mounted to substrate 40. Substrate 40 may be a rigid printed circuit board (e.g., a printed circuit board formed from fiberglass-filled epoxy), a plastic carrier (e.g., a plastic carrier with patterned metal traces), a flexible printed circuit board assembly (e.g., a flex circuit formed from a flexible polymer sheet with conductive traces that has been mounted on a support structure), or other suitable substrate. Switches 44 may be any suitable switches such as dome switches or tactile ("tac") switches that contain rectangular housings, internal dome switch members, a covering film, and electrical contacts that are soldered to traces in printed circuit board substrate 40.

During operation, a user of button 28 may press inwardly on a button region such as region 30, 32, or 34 to activate an associated one of switches 44. A flexible member such as flexible metal member 38 may be interposed between button cover 36 and substrate (e.g., printed circuit board) 40. Flexible metal member 38 (which may sometimes be referred to as a clip or clip member) may be used as an interface structure that assists in attaching button member 36 to printed circuit board 40. When a user presses on a region such as region 30, 32, or 34, the associated portion of clip 38 will bend downward and will actuate a corresponding one of switches 44.

Clip 38 may be formed from a flexible metal such as a thin sheet of stainless steel (e.g., stainless steel having a thickness of less than 0.5 mm, less than 0.2 mm, or less than 0.1 mm, as examples). Clip 38 may be formed into a desired shape by a metal stamping tool, laser cutting, machining with a cutting tool, etc.

Button cover 36 may have integral heat stake members that are coupled to clip 38. Clip 38 may have snap features such as snap arms 48. Snap arms 48 may have engagement features such as holes 50 or other openings. Holes 50 may be configured to mate with corresponding snap members such as prongs 46. Prongs 46 may have sloped surfaces that form a lead-in shape that helps to bend arms 48 out and over prongs 46 when clip 38 is pressed downwards towards printed circuit board 40 during assembly. Prongs 46 may therefore sometimes be referred to as snap lead-in members.

To facilitate large volume assembly, it may be desirable to form snap lead-in members 46 from structures that may be mounted on printed circuit board using surface mount technology (SMT). For example, lead-in members 46 may be formed from solder-compatible structures that can be soldered to board 40 using pick-and-place tools. Any suitable number of snaps may be used in connecting button cover 36 to printed circuit board 40. In the examples of FIG. 2, two snaps are used.

Printed circuit board 40 may be attached to lower housing portion 42 using heat stakes or other suitable attachment mechanisms.

Figure 3:
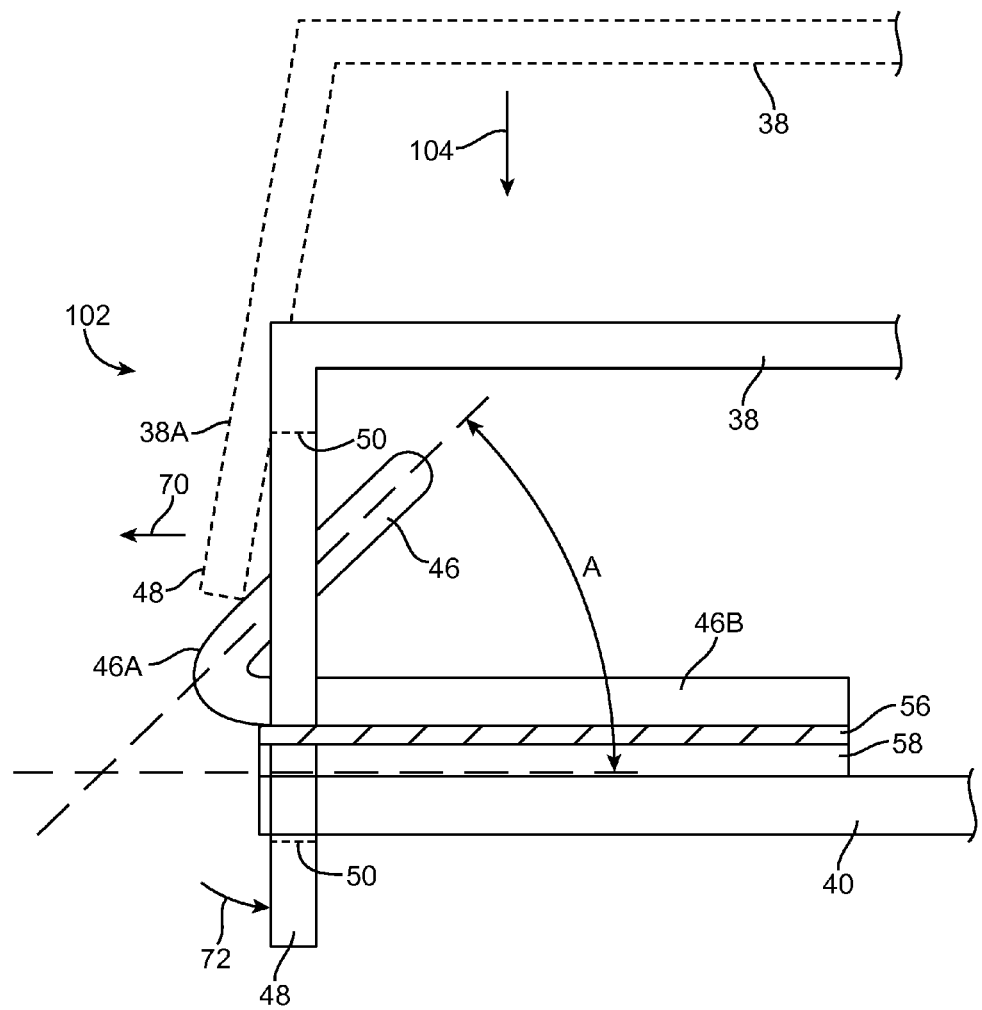
FIG. 3 is a side view of an illustrative snap formed using a snap arm with an opening and a snap member that protrudes into the opening and that is soldered to a solder pad on a printed circuit board in accordance with an embodiment of the present invention.

FIG. 3 is a cross-sectional side view of clip 38 and printed circuit board 40 in the vicinity of a snap (snap 102). Snap 102 may include snap arm 48 and mating snap lead-in member 46. Initially, clip 38 may have the position shown in dashed lines. When pressed downward in direction 104 arm 48 strikes lead-in member 46. Surface 46A of lead-in member 46 is angled away from the planar surface of printed circuit board 40 (i.e., at angle A in FIG. 3), so surface 46A helps to bend arm 48 in direction 70 as clip 38 is moved in direction 104. As clip 38 continues to move in direction 104, arm 48 rides up an over lead-in member 46 until hole 50 in arm 48 has moved into alignment with lead-in member 46. Once aligned, arm 48 will spring back in direction 72 until reaching the position shown in FIG. 3. In this position, the prong formed by snap lead-in member 46 will protrude into hole 50 and will engage arm 48. By forming the size of prong 46 to match the size of hole 50, excessive motion between button cover 36 and printed circuit board 40 can be avoided.

To facilitate high volume manufacturing, snap lead-in member 46 may be formed from a structure that is suitable for mounting to printed circuit board 40 using surface mount technology (SMT) mounting techniques (e.g., mounting using solder and a pick-and-place tool). As shown in FIG. 3, for example, solder 56 may be formed under planar portion 46B of lead-in member 46 and may be used to solder lead-in member 46 to metal trace (solder pad) 58 on the upper surface of printed circuit board 40.

Figure 4:
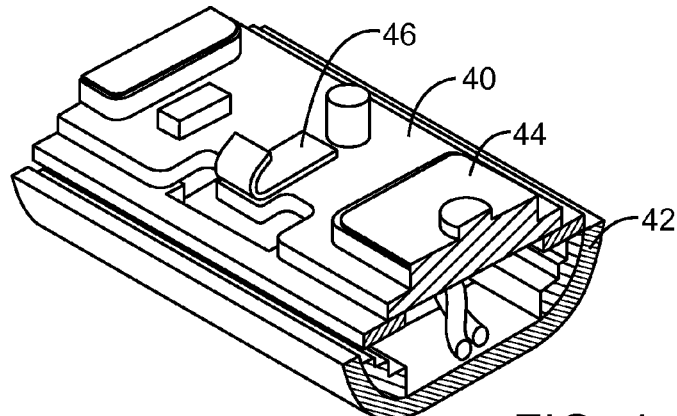
FIG. 4 is a perspective view of an interior portion of an illustrative button having a snap structure formed from a bent metal strip in accordance with an embodiment of the present invention.
Figure 5:
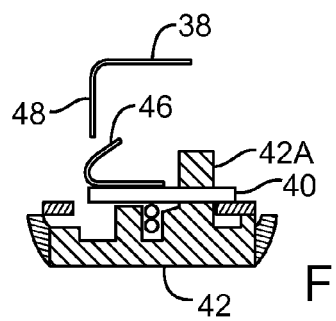
FIG. 5 is a cross-sectional end view of an illustrative button having snaps in accordance with an embodiment of the present invention.

FIG. 4 is a perspective view of an interior portion of button 28. As shown in FIG. 4, snap lead-in member 46 may be implemented using a bent metal strip. Other configurations may be used for lead-in member 46 if desired (e.g., bent pieces of metal with different shapes, cast metal parts, machined metal structures, structures formed from other materials such as plastic that have been coated with metal, structures formed from composites, etc.). FIG. 5 is a cross-sectional end view of clip 38, printed circuit board 40, and lower housing 42 in a configuration in which clip 38 is being lowered towards lead-in member 46 during assembly.

Figure 6:
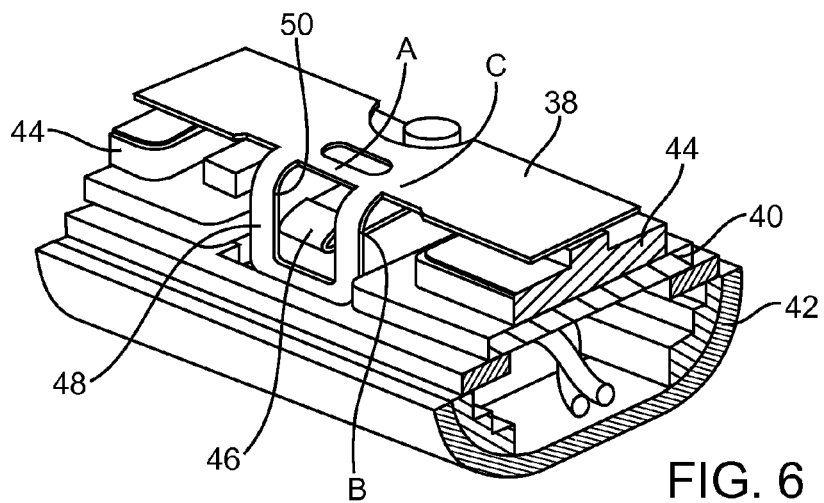
FIG. 6 is a perspective view of an interior portion of a button having a snap member formed from a solid metal structure in accordance with an embodiment of the present invention.

FIG. 6 is a perspective view of an illustrative interior portion of button 28 showing how snap lead-in member 46 may be formed from a cast metal structure in which the ramped lead-in surface of the member is formed from a portion of the body of the lead-in member itself, rather than the surface of a bent piece of metal that extends upward from the lower portions of the snap lead-in member.

Figure 7:
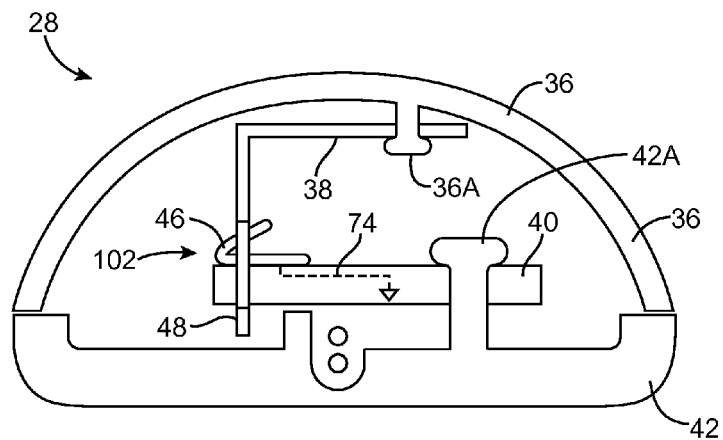
FIG. 7 is a cross-sectional end view of an illustrative button having a snap in accordance with an embodiment of the present invention.

FIG. 7 is a cross-sectional end view of button 28 showing how button cover 36 may have integral heat stakes such as heat stack 36A and showing how lower housing 42 may have integral heat stakes such as heat stake 42A. Heat stakes such as heat stake 36A or other fastening mechanism may be used to attach button cover 36 to clip 38. Heat stakes such as heat stake 42A or other fastening mechanism may be used to connect housing portion 42 to printed circuit board 40. Snaps such as snap 102 may be used to attach clip 38 and therefore button cover 36 to printed circuit board 40 and therefore lower housing 42.

Each snap 102 may include a snap arm such as snap arm 48 and a snap lead-in member such as snap lead-in member 46 that mates with an opening in snap arm 48. Snap arm 48 preferably has sufficient flexibility to ride over the protrusion formed by lead-in member 46 when clip 38 is pressed into place.

To reduce the likelihood of damage to circuitry such as switches 44 during electrostatic discharge events, it may be desirable to ground metal button parts such as clip 38. With one suitable arrangement, a grounding path for clip 38 may be provided through lead-in member 48 and ground path 74. Ground path 74 may be formed, for example, be conductive traces in printed circuit board 40 that connect to a ground terminal.

Figure 8:
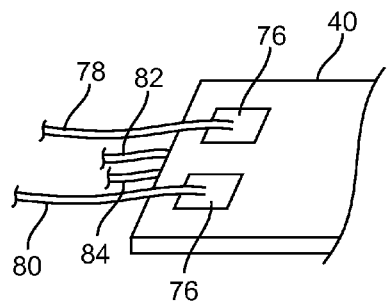
FIG. 8 is a perspective view of a portion of a printed circuit board in a button of the type shown in FIG. 1 showing how pads on the printed circuit board may be attached to signal and ground wires in accordance with an embodiment of the present invention.

As shown in FIG. 8, a ground terminal in button 28 may be formed by pads such as pads 76 on printed circuit board 40. Wires such as wires 82 and 84 may pass through button 28 without electrically connecting to the switches of button 28 (e.g., to form the two wires in path segment 16 of FIG. 1). Wires such as wires 78 and 80 may be coupled to pads 76. Wire 78 may be a ground wire and wire 80 may be a signal wire for carrying button data (as an example). In this type of configuration, the pad 76 to which wire 78 is coupled may form a ground terminal and may be coupled to ground traces 74 (FIG. 7).

When forming an electrostatic discharge grounding path between clip 38 and lead-in member 46, electrical contact may be made between clip 38 and lead-in member 46 using spring structures or other structures that are suitable for creating low-contact-resistance paths. Illustrative locations at which lead-in member 46 may contact clip 38 include locations A, B, and C in FIG. 6. Spring structures for forming electrical connections with clip 38 at locations A, B, and C may, if desired, be formed as integral parts of lead-in member 46.

Figure 9:
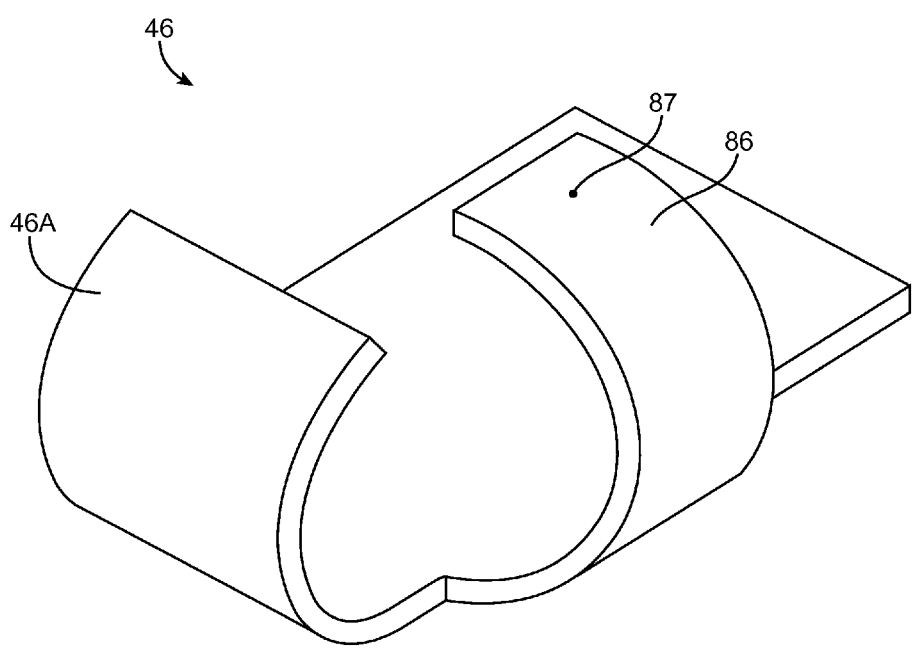
FIG. 9 is a perspective view of snap member with a spring-shaped arm that may be used in forming an electrical contact with a snap arm on a clip in accordance with an embodiment of the present invention.

FIG. 9 is a perspective view of an illustrative configuration that may be used for lead-in member 46 showing how lead-in member 46 may have a structure such as spring structure 86 that forms a contact with clip 38. Spring structure 86 may, for example, make electrical contact with clip 38 by pressing point 87 of spring structure 86 against clip 38 at location C (FIG. 6).

Figure 10:
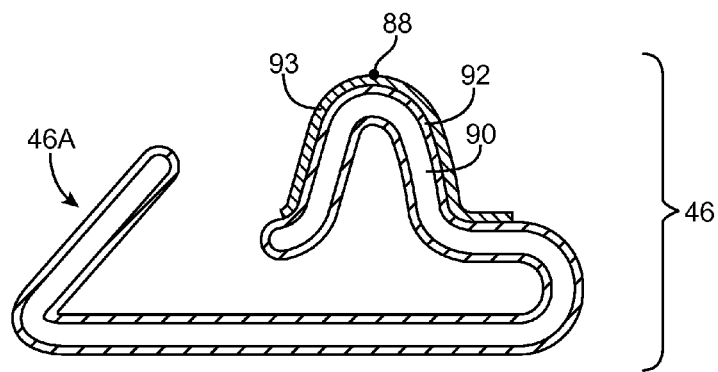
FIG. 10 is a side view of a snap member with a protruding spring shape for forming an electrical connection with a snap arm that is formed from part of a clip in accordance with an embodiment of the present invention.

FIG. 10 is a side view of an illustrative lead-in member having a region such as region 88 that may form a contact with clip 38 at location A (FIG. 6). As illustrated in FIG. 10, lead-in member 46 (and, if desired, clip 38) may contain multiple layers of material. For example, lead-in member 46 may include a base member 90, a first coating 92, and a second coating 93. Base member 90 may be formed from a material such as stainless steel or spring metal (e.g., a beryllium copper alloy). Coating 92 may be a blanket coating that is formed over the entire surface of member 90. Coating 92 may be, for example, a nickel coating that provides member 90 with a solder-attracting (solderphilic) coating. Costing 93 may be, for example, a localized coating of a material such as gold that exhibits low contact resistance when pressed against other metals.

Figure 11:
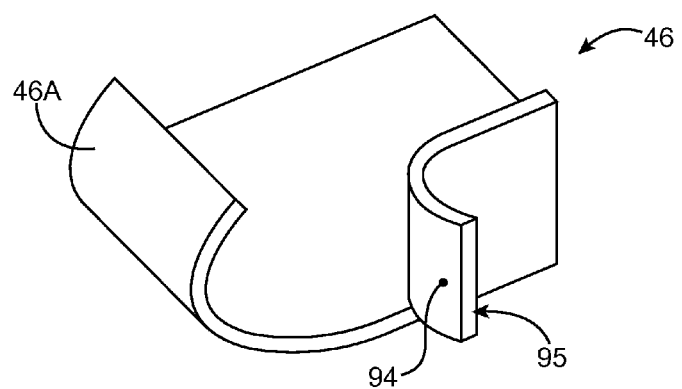
FIG. 11 is a perspective view of an illustrative snap member having a spring portion for forming a ground connection in accordance with an embodiment of the present invention.

FIG. 11 is a perspective view of an illustrative configuration for lead-in member 46 in which lead-in member 46 has a spring structure such as spring structure 95 that make electrical contact with clip 38 by pressing point 94 of spring structure 95 against clip 38 at location B (FIG. 6).

Figure 12:
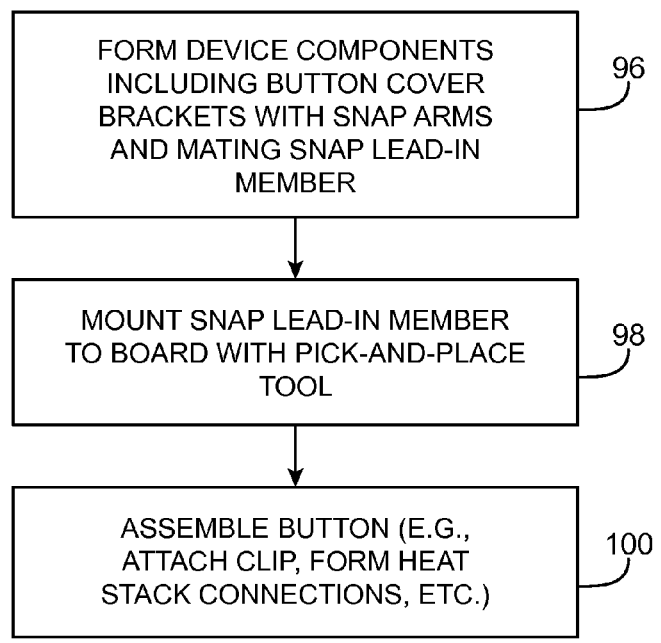
FIG. 12 is a flow chart of illustrative steps involved in manufacturing devices having snaps in accordance with an embodiment of the present invention.

Illustrative steps involved in forming electrical devices such as button 28 of FIG. 1 or other components using snaps such as snap 102 are shown in FIG. 12.

At step 96, the structure that form button 28 and snaps 102 may be formed. For example, injection molding or other techniques may be used to form parts such as button cover 36 and housing 42 from plastic. Stamping or machining techniques may be used to form metal parts such as clip 38 and the metal parts that make up lead-in member 46. Coatings such as solderphilic and low-resistance coatings may be applied to clip 38 and/or lead-in member 46.

At step 98, lead-in members 46 may be soldered to mating solder pads on printed circuit board 40 using a pick-and-place tool or other equipment.

At step 100, the structures that form button 28 such as button cover 36, clip 38, snaps 102 (formed from snap members such as snap arms 48 and snap members such as lead-in members 46), printed circuit board 40, and lower housing 42 may be assembled to form a finished structure (e.g., button 28 or other device). For example, button cover 36 may be heat staked to clip 38, housing structure 42 may be heat staked to printed circuit board 40, and the snap arm members and snap lead-in members in snaps 102 may be connected together. Electrical connections between clip 38 and ground in printed circuit board 40 may be formed by using spring portions of lead-in member 46 to press against corresponding portions of arm 48.

The foregoing is merely illustrative of the principles of this invention and various modifications can be made by those skilled in the art without departing from the scope and spirit of the invention.

What is claimed is:

1. Apparatus, comprising: a substrate; a metal clip, wherein a portion of the metal clip forms a snap arm with an opening; a snap member, wherein the snap member has a portion that protrudes into the opening and a portion that is soldered to the substrate and wherein the snap member comprises a solderphilic coating; and a plastic member that is mounted to the clip.

2. The apparatus defined in claim 1 wherein the substrate comprises a printed circuit board.

3. The apparatus defined in claim 2, wherein the printed circuit board is electrically coupled to an audio jack.

4. The apparatus defined in claim 2, wherein the printed circuit board is electrically coupled to a plurality of speakers.

5. The apparatus defined in claim 1 wherein the plastic member comprises a button cover.

6. The apparatus defined in claim 5 wherein the button cover comprises a heat stake with which the button cover is attached to the clip.

7. The apparatus defined in claim 1 further comprising a low-contact-resistance coating over at least a portion of the solderphilic coating.

8. The apparatus defined in claim 1 wherein the snap member comprises a spring structure that bears against a portion of the snap arm.

9. The apparatus defined in claim 1 further comprising an upper device housing portion and a lower device housing portion, wherein the snap member and the snap arm are mounted between the upper housing portion and the lower housing portion.

* * * * *